(12) United States Patent
Zhang et al.

(10) Patent No.: US 9,613,682 B2
(45) Date of Patent: Apr. 4, 2017

(54) FINFET 6T SRAM CELL STRUCTURE

(71) Applicant: SEMICONDUCTOR MANUFACTURING INTERNATIONAL (SHANGHAI) CORPORATION, Shanghai (CN)

(72) Inventors: Gong Zhang, Shanghai (CN); Nan Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/921,963

(22) Filed: Oct. 23, 2015

(65) Prior Publication Data

US 2016/0155492 A1  Jun. 2, 2016

(30) Foreign Application Priority Data

Dec. 1, 2014  (CN) .......................... 2014 1 0712009

(51) Int. Cl.
| | |
|---|---|
| *G11C 11/00* | (2006.01) |
| *G11C 11/412* | (2006.01) |
| *H01L 27/02* | (2006.01) |
| *G11C 11/418* | (2006.01) |
| *H01L 27/11* | (2006.01) |
| *G11C 11/419* | (2006.01) |

(52) U.S. Cl.
CPC .......... *G11C 11/412* (2013.01); *G11C 11/418* (2013.01); *H01L 27/0207* (2013.01); *H01L 27/1104* (2013.01); *G11C 11/419* (2013.01); *H01L 27/11* (2013.01)

(58) Field of Classification Search
CPC .. H01L 27/1104; H01L 27/0207; H01L 27/11; G11C 11/412; G11C 11/419; G11C 11/418
USPC ...................... 365/189.11, 154, 156
See application file for complete search history.

(56) References Cited

U.S. PATENT DOCUMENTS 9,007,815 B2 *  4/2015  Liaw ..................... G11C 11/417
                                                                365/154

* cited by examiner

*Primary Examiner* — David Lam
(74) *Attorney, Agent, or Firm* — Kilpatrick Townsend and Stockton LLP

(57) ABSTRACT

A static memory circuit includes a pull-up transistor, a pull-down transistor, a pass-gate transistor associated with the pull-up and pull-down transistors, and first and second word lines electrically insulated from each other. The pass-gate transistor includes a number of Fins and a gate electrode having a number of first and second gates, each one of the gates is disposed on one of the Fins, the first gates are connected to the first word line, and the second gates are connected to the second word line. During a read operation, one of the first and second word lines is asserted low, so that the beta ratio is greater than or equal to a first predetermined value. During a write operation, one of the first and second word lines is asserted high; so that a gamma ratio is greater than or equal to a second predetermined value.

15 Claims, 7 Drawing Sheets

FINFET 6T SRAM CELL STRUCTURE

CROSS-REFERENCES TO RELATED APPLICATIONS

The present application claims priority to Chinese patent application No. 201410712009.5, filed with the State Intellectual Property Office of People's Republic of China on Dec. 1, 2014, the content of which is incorporated herein by reference in its entirety.

FIELD OF THE INVENTION

The present invention relates to semiconductor memory devices, and more particularly to a static random access memory cell structure including FinFET transistors, and a manufacturing method thereof.

BACKGROUND OF THE INVENTION

FIG. 1A is a schematic circuit diagram of a FinFET (Fin Field Effect Transistor) 6T (6 transistors) SRAM (Static Random Access Memory) device, as known in the prior art. The FinFET 6T SRAM device includes a first pull-up (PU) transistor 101, a first pull-down (PD) transistor 102, a first pass-gate (PG) transistor 105, a second PU transistor 103, a second PD transistor 104, and a second PG transistor 106. First PG transistor 105 has a source terminal connected to a bit line (BL), second PG transistor 106 has a source connected to BLB. BL and BLB are complementary signals. The gate terminals of the first and second PG transistors are connected to a word line (WL).

In a read operation, the work line is asserted high, the drain terminal and the source terminal of first PG transistor 105 are connected, and the drain terminal and the source terminal of second PG transistor 106 are connected. For example, a node 11 stores data "0," since the first PU transistor and the first PD transistor form a first inverter, and the second PU transistor and the second PD transistor form a second inverter, a node 12 stores data "1", so that the drain terminal and the source terminal of first PD transistor are connected, and the drain terminal and the source terminal of first PU transistor are not connected. When the bit line BL is connected to a high voltage level (referred to as logic "1" hereinafter), the charge of the bit line BL is transferred through first PG transistor 105 to node 11 (e.g., storing data "0"), generating thus a current $I_{PG}$, and through first PD transistor 102 to ground $V_{SS}$, generating thus a current $I_{PD}$, thereby performing a discharge. At this point, the bit line BL is going from high to low, data "0" is read. For the complimentary bit line BLB, which is connected to a low voltage level (referred to as logic "0" hereinafter), the "0" storing at node 11 turns on second PU transistor 103 to connect the source terminal to the drain terminal of second PU transistor and turns off second PD transistor 104 so that its source terminal is not connected to its drain terminal. The high voltage level "1" of the voltage source Vdd flows toward the complementary bit line BLB, turning the low voltage level of the complementary bit line BLB to a high voltage level. As it can be seen, the larger the current IPD is with regard to IPG $$\left(\text{i.e., the greater the ratio } \beta = \frac{I_{PD}}{I_{PG}}\right),$$

the higher is the charge flowing from the bit line BL through the PG transistor to node 11, and as much as possible flowing to ground $V_{SS}$, so that there is no charge accumulation at node 11, thereby reducing interference at the node to achieve a better read noise margin.

In a write operation, if node 11 stores data "0," then node 12 stores data "1." In a write operation, such as to write a "1" to node 11, the stored "0" will become a "1." The bit line BL is asserted high, the complementary bit line BLB is asserted low. The word line WL is asserted high, the drain terminal and the source terminal of second PG transistor 106 are connected, generating thus a current $I'_G$ flowing from node 12 to the complementary bit line BLB. Since node 11 stores data "0," the source terminal and the drain terminal of second PU transistor 103 are connected, generating a current $I_{PU}$ flowing from the voltage source Vdd to node 12. The greater the current $I'_{PG}$ with regard to the current IPU is, the faster the data "1" stored in node 12 can be pulled toward "0," the "1" of node 12 becomes "0". The source terminal and the drain terminal of first PU transistor 101 are connected, so that the high voltage level "1" changes the "0" of node 11 to "1", and the write operation is complete. As it can be seen, the larger the current $I'_{PG}$ is with regard to $I_{PU}$ $$\left(\text{i.e., the greater the ratio } \gamma = \frac{I'_{PG}}{I_{PU}}\right),$$

the faster the write operation can be complete to achieve a better write margin.

However, conventional FinFET 6T SRAM devices have small β and γ ratios, resulting in a poor read noise margin and write margin.

FIG. 1B is a layout of a FinFET 6T SRAM device, as known in the prior art. As shown in FIG. 1B, the ratio of the number of Fins of the respective PU, PD, and PG transistors of the FinFET 6T SRAM device is PU:PD:PG=1:2:2, since the ratio of the amount of current flowing through each transistor is equal to the number of Fins of the corresponding turned-on FinFET transistor, the β ratio may be realized by the ratio of the number of Fins of PD and PG transistors, i.e., $$\beta = \frac{PD}{PG} = \frac{2}{2} = 1,$$

the β ratio of 1 provides a poor read noise margin. This is because a smaller β ratio means that the charge from the bit line BL (e.g., data "1") through the PG transistor to reach node 11 (e.g., data "0") does not completely flow from the PD transistor to ground $V_{SS}$, node 11 may have a charge accumulation resulting in interference at the node.

FIG. 1C is another layout of a FinFET 6T SRAM device, as known in the prior art. As shown in FIG. 1C, the ratio of the number of Fins of the PU, PD, and PG transistors of the FinFET 6T SRAM device is PU:PD:PG=1:2:1, $$\beta = \frac{PD}{PG} = \frac{2}{1} = 2,$$

thereby achieving a better read noise margin, however, this layout will produce some side effects. Since the ratio of the amount of current flowing through each transistor is equal to the number of Fins of the corresponding turned-on FinFET transistor, the γ ratio can be realized by the ratio of PG and PU Fin transistors, i.e., $$\gamma = \frac{PG}{PU} = \frac{1}{1} = 1,$$

the γ ratio of 1 provides a poor write margin. This is because a smaller γ ratio will make the process of changing from the original data "1" of node 11 to "0" of the bit line BL relatively slow.

Thus, there is a need to solve the problems of poor read noise margin and poor write margin of conventional FinFET 6T SRAM devices.

BRIEF SUMMARY OF THE INVENTION

Embodiments of the present invention provide a static memory circuit comprising a pull-up (PU) transistor including a number of Fins, a pull-down (PD) transistor including a number of Fins, a pass-gate (PG) transistor associated with the PU transistor and the PD transistor, and first and second word lines electrically that are insulated from each other. The PG transistor includes a number of Fins and a gate electrode including a number of first gates and a number of second gates, each of the first and second gates is disposed on one of the Fins of the PG transistor, the first gates are connected to the first word line, and the second gates are connected to the second word line. During a read operation, one of the first and second word lines is asserted low, so that a ratio of the number of Fins of the PD transistor and the number of Fins of the PG transistor is greater than or equal to a predetermined read noise margin value. During a write operation, one of the first and second word lines is asserted high, so that a ratio of the number of Fins of the PG transistor and the number of Fins of the PU transistor is greater than or equal to a predetermined write margin value.

In one embodiment, the ratio of the number of Fins of the PU transistor, the number of Fins of the PD transistor, and the number of Fins of the PG transistor is 1:2:2.

In one embodiment, the number of Fins of the PU transistor is 1, the number of Fins of the PD transistor is 2, the number of Fins of the PG transistor is 2, the number of first gates is 1, and the number of second gates is 1; or the number of Fins of the PU transistor is 2, the number of Fins of the PD transistor is 4, the number of Fins of the PG transistor is 4, the number of first gates is 1, and the number of second gates is 3; or the number of first gates is 2, and the number of second gates is 2; or the number of Fins of the PU transistor is 3, the number of Fins of the PD transistor is 6, the number of Fins of the PG transistor is 6, the number of first gates is 1, and the number of second gates is 5; or, the number of first gates is 2, and the number of second gates is 4; or, the number of first gates is 3, and the number of second gates is 3.

In one embodiment, the ratio of the number of Fins of the PU transistor, the number of Fins of the PD transistor, and the number of Fins of the PG transistor is 1:3:3.

In one embodiment, the number of Fins of the PU transistor is 1, the number of Fins of the PD transistor is 3, the number of Fins of the PG transistor is 3, the number of first gates is 1, and the number of second gates is 2; or the number of Fins of the PU transistor is 2, the number of Fins of the PD transistor is 6, the number of Fins of the PG transistor is 6, the number of first gates is 1, and the number of second gates is 5; or, the number of first gates is 2, and the number of second gates is 4; or, the number of first gates is 3, and the number of second gates is 3; or the number of Fins of the PU transistor is 3, the number of Fins of the PD transistor is 9, the number of Fins of the PG transistor is 9, the number of first gates is 1, and the number of second gates is 8; or, the number of first gates is 2, and the number of second gates is 7; or, the number of first gates is 3, and the number of second gates is 6, or, the number of first gates is 4, and the number of second gates is 5.

In one embodiment, the first predetermined value is 1.2 and the second predetermined value is 1.5.

In one embodiment, the PU transistor is a PMOS transistor, and each of the PD and PG transistors is an NMOS transistor.

Embodiments of the present invention also provide a static memory circuit comprising a number of word lines, a bit line, and first and second units. Each of the first and second units includes a pull-up (PU) transistor comprising a number of Fins, a pull-down (PD) transistor comprising a number of Fins, and a pass-gate (PG) transistor comprising a number of Fins, a gate electrode connected to the word line, a source or a drain connected to the bit line. The ratio of the number of Fins of the PD transistor and the number of Fins of the PG transistor is greater than or equal to a first predetermined value, and the ratio of the number of Fins of the PG transistor and the number of Fins of the PU transistor is greater than or equal to a second predetermined value.

In one embodiment, the number of word lines is 1, a ratio of the number of Fins of the PU transistor, the number of Fins of the PD transistor, and the number of Fins of the PG transistor is 1:4:2.

In one embodiment, the number of word lines is 2 and includes a first word line and a second word line electrically insulated from each other. The gate electrode comprises a number of first gates and a number of second gates, each one of the gates is disposed on one of the Fins of the PG transistor, the first gates are connected to the first word line, and the second gates are connected to the second word line, wherein one of the first and second word lines is asserted low during a read operation, and asserted high during a write operation.

In one embodiment, the number of Fins of the PU transistor in the first unit is equal to the number of Fins of the PU transistor in the second unit, the number of Fins of the PD transistor in the first unit is equal to the number of Fins of the PD transistor in the second unit, and the number of Fins of the PG transistor in the first unit is equal to the number of Fins of the PG transistor in the second unit.

In one embodiment, the number of Fins of the PU transistor in the first unit is not equal to the number of Fins of the PU transistor in the second unit; or, the number of Fins of the PD transistor in the first unit is not equal to the number of Fins of the PD transistor in the second unit; or, the number of Fins of the PG transistor in the first unit is not equal to the number of Fins of the PG transistor in the second unit.

Embodiments of the present invention also provide a semiconductor device. The semiconductor device includes a substrate, and a static memory circuit comprising a number of word lines, a bit line, and a first unit and a second unit. Each of the first and second units includes a pull-up (PU) transistor comprising a number of Fins, a pull-down (PD) transistor comprising a number of Fins, a pass-gate (PG) transistor comprising a number of Fins, a gate electrode connected to the word lines, and a source or a drain connected to the bit line. The ratio of the number of Fins of the PD transistor and the number of Fins of the PG transistor is greater than or equal to a first predetermined value, and the ratio of the number of Fins of the PG transistor and the number of Fins of the PU transistor is greater than or equal to a second predetermined value.

In one embodiment, the substrate includes a first active region, a second active region, a third active region, and a fourth active region. In the first unit, the PU transistor is disposed in the second active region, and the PD transistor and the PG transistor are disposed in the first active region, and in the second unit, the PU transistor is disposed in the third active region, and the PD transistor and the PG transistor are disposed in the fourth active region.

In one embodiment, the first active region is a p-well region, the second active region is an n-well region, the third active region is an n-well region, and the fourth active region is a p-well region.

Embodiments of the present invention also includes a method for manufacturing a static memory circuit. The method includes providing a substrate, forming a pull-up (PU) transistor, a pull-down (PD) transistor and a pass-gate (PG) transistor on the substrate, and forming first and second word lines. The PG transistor comprises a number of Fins and a gate electrode comprising a number of first gates and a number of second gates insulating from each other, the number of first and second gates corresponding to the number of Fins, and the first word line is connected to the first gates, and the second word line is connected to the second gates.

In one embodiment, forming the first and second word lines may include forming an oxide layer on the substrate, forming first and second trenches associated with the first and second word lines, depositing a metal material filling the first and second trenches, and removing an excess metal material outside of the first and second trenches by performing a planarization process.

The following detailed description together with the accompanying drawings will provide a better understanding of the nature and advantages of the present invention.

DETAILED DESCRIPTION OF THE INVENTION

Figure 1A:
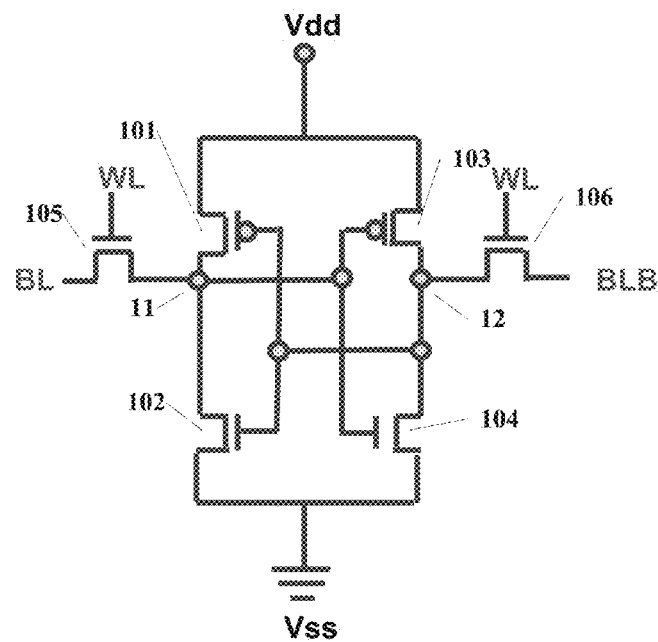
FIG. 1A is a simplified schematic circuit of a FinFET 6T SRAM device, as known in the prior art.
Figure 1B:
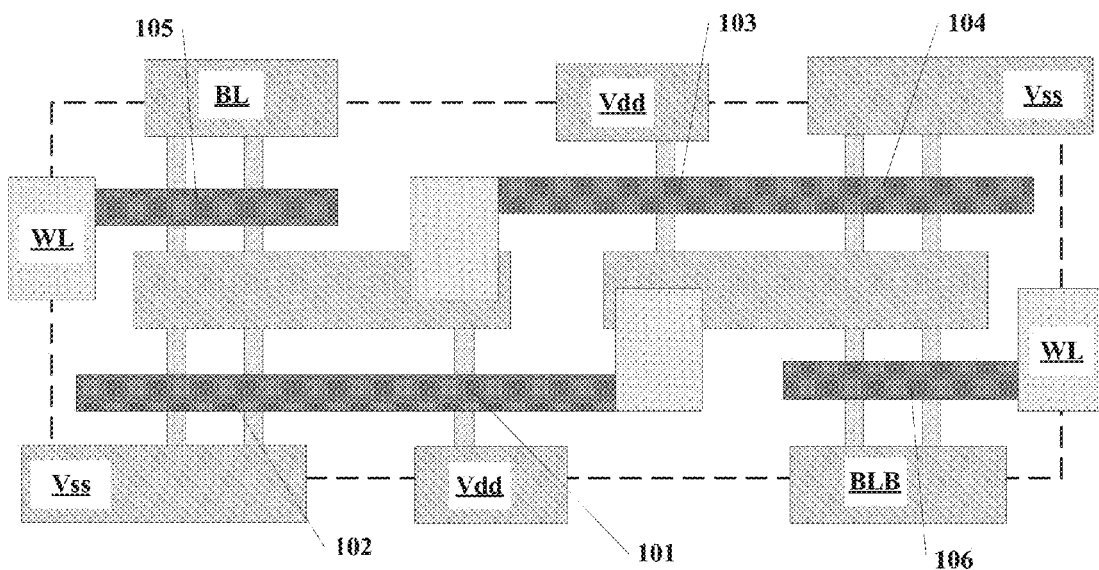
FIG. 1B is a layout of some components of a FinFET 6T SRAM device, as known in the prior art.
Figure 1C:
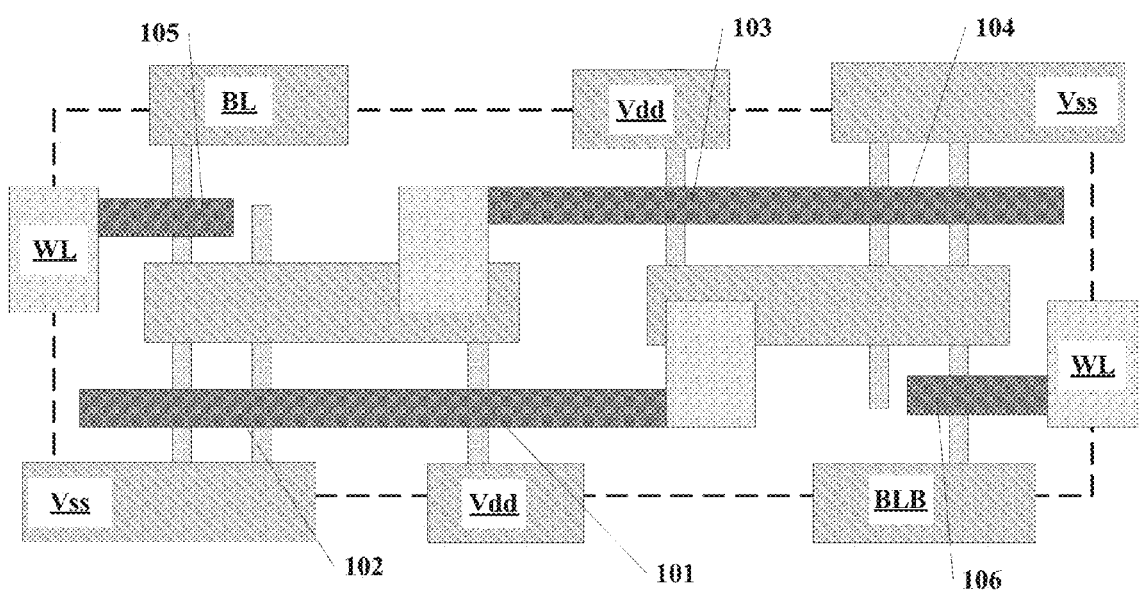
FIG. 1C is another layout of some components of a FinFET 6T SRAM device, as known in the prior art.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

The terminology used herein is for the purpose of describing particular embodiments only and is not intended to be limiting of the invention. As used herein, the singular forms "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Method and devices known to people of skill in the art will not be discussed in detail for the sake of brevity. The conventional known techniques, methods and equipment should be considered as part of this disclosure.

Specific values provided in the exemplary embodiments shown and described herein should be construed as illustrative and not limiting. Thus, other exemplary embodiments may have different values.

It should be noted that like reference numerals and letters refer to similar items in the following figures. Thus, once an element is defined in one of the figures, it will not be further described in subsequent figures.

It will be understood that when an element is referred to as being "connected" to another element, it can be directly connected to other element or intervening elements may be present. In contrast, when an element is referred to as being "directly connected to" another element, there are no intervening elements present.

The term "ratio" is referred to as the driving strength ratio between the different types of transistors. For example, an "α" (alfa) ratio is referred to as the driving strength ratio between the pull-down transistor and the pull-up transistor. A "β" (beta) ratio is referred to as the driving strength ratio between the pull-down transistor and the pass-gate transistor. A "γ" (gamma) ratio is referred to as the driving strength ratio between the pull-down transistor and the pass-gate transistor.

The inventors discovered that, when the β ratio is ≥1.2, a static memory cell may have a better read noise margin (e.g., greater than 100 mV), and when the γ ratio is ≥1.5, a static memory cell may have a better write margin (e.g., greater than 200 mV).

According to some embodiments of the present invention, a static memory circuit or cell may include two units, each unit includes a pull-up transistor, a pull-down transistor, and a pass-gate transistor. The pass-gate transistor includes two or more Fins and gate electrodes formed on the corresponding Fins. The gate electrodes are connected to a word line, and the source terminal of the pass-gate transistor is connected to a bit line, or the drain terminal of the pass-gate transistor is connected to a bit line. In a unit, the ratio of the number of Fins of the pull-down transistor and the number of conducting Fins (conducting fin channels) of the pass-gate transistor is greater than or equal to a preset value of a read noise margin (e.g., 1.2), and a ratio of the number of the conducting Fins of the pass-gate transistor and the number of Fins of the pull-up transistor is greater than or equal to a preset value of a write margin (e.g., 1.5).

In some embodiments, by setting the number of components in a unit of the static memory circuit (cell), the ratio of the number of Fins in the pull-down transistor and the number of Fins in the pass-gate transistor is greater than or equal to a preset value of a read noise margin to obtain a desired read noise margin. By selecting the ratio of the number of Fins in the pass-gate transistor and the number of Fins in the pull-up transistor greater than or equal to a preset value of a write margin to obtain a desired write margin. The present invention can thus improve the read noise margin and the write margin of the static memory circuit.

In the embodiment, the static memory circuit may include a word line, and the ratio of the number of Fins in the pull-up transistor, the number of Fins in the pull-down transistor, and the number of Fins in the pass-gate transistor in each unit is 1:4:2.

For example, the static memory circuit includes first and second units. The first unit includes a first pull-up (PU) transistor, a first pull-down (PD) transistor, and a first pass-gate (PG) transistor. The second unit includes a second pull-up (PU) transistor, a second pull-down (PD) transistor, and a second pass-gate (PG) transistor. In the first unit, the number of Fins in the first PU transistor is 1 (one), the number of Fins in the first PD transistor is 4 (four), and the number of Fins in the first PG transistor is 2 (two). In the second unit, the number of Fins in the second PU transistor is 1 (one), the number of Fins in the second PD transistor is 4 (four), and the number of Fins in the second PG transistor is 2 (two). Thus, in the read operation, $$\beta = \frac{PD}{PG} = \frac{4}{2} = 2,$$

so that an improved read noise margin can be achieved. In the write operation, $$\gamma = \frac{PG}{PU} = \frac{2}{1} = 2,$$

so that an improved write margin can be achieved.

In an embodiment, the static memory circuit may include 1 word line, the ratio of the number of fins in the PU transistor, the number of fins in the PD transistor, and the number of fins in the PG transistor in each unit is 1:4:2, so that in the read and write operations, an improved read noise margin and a write margin can be obtained.

In another embodiment, the static memory circuit may include 2 word lines including a first word line and a second word line. In each unit, the gate electrode of the PG transistor includes a first gate connected to the first word line and a second gate connected to the second word line. The first and second gates are insulated from each other. One of the first and second word lines is asserted a low voltage level (alternatively referred to as "logic low" or "low" hereinafter) during a read operation and is asserted a high voltage level (alternatively referred to as "logic high" or "high" hereinafter) during a write operation In one embodiment, the static memory circuit includes a pull-up transistor, a pull-down transistor, and a pass-gate transistor. The pass-gate transistor includes two or more Fins and a gate electrode formed on the corresponding Fins. The gate electrode includes a first gate connected to the first word line and a second gate connected to the second word line, the first and second gates are electrically insulated from each other. One of the first and second word lines is asserted low during a read operation, and asserted high during a write operation, so that the ratio of the number of Fins of the pull-down transistor and the number of the Fins of the pass-gate transistor is greater than or equal to a preset value of a read noise margin (e.g., 1.2), and a ratio of the number of the Fins of the pass-gate transistors and the number of Fins of the pull-up transistor is greater than or equal to a preset value of a read noise margin (e.g., 1.5).

In one embodiment, the static memory circuit may include first and second word lines, the PG transistor includes two or more Fins and a gate structure associated with the Fins. The gate structure includes a first gate connected to the first word line and a second gate connected to the second word line, and the first and second gates are electrically insulated from each other. One of the first and second word lines is asserted low during a read operation, and asserted high during a write operation, so that the ratio of the number of Fins of the pull-down transistor and the number of the Fins of the pass-gate transistor is greater than or equal to a preset value of a read noise margin to obtain a desired read noise margin, and the ratio of the number of the Fins of the pass-gate transistors and the number of Fins of the pull-up transistor is greater than or equal to a preset value of a write margin to obtain a desired write margin. Accordingly, the present invent may improve the read noise margin and the write margin.

In an exemplary embodiment, a static memory circuit or cell in the following description includes two units, and each of the two units includes a PU transistor, a PD transistor, and a PG transistor. In the exemplary embodiment, the static memory circuit or cell includes two symmetrical units, i.e., the first and second units each have an equal number of Fins of the PU transistor, an equal number of Fins of the PD transistor, and an equal number of Fins of the PG transistor. The symmetrical circuit configuration enables that reading a "1" and "0" can have the same read speed, and write a "1" and "0" can have the same write speed. Of course, those of skill in the art may use non-symmetrical memory circuit or cell based on actual application requirements.

Figure 2A:
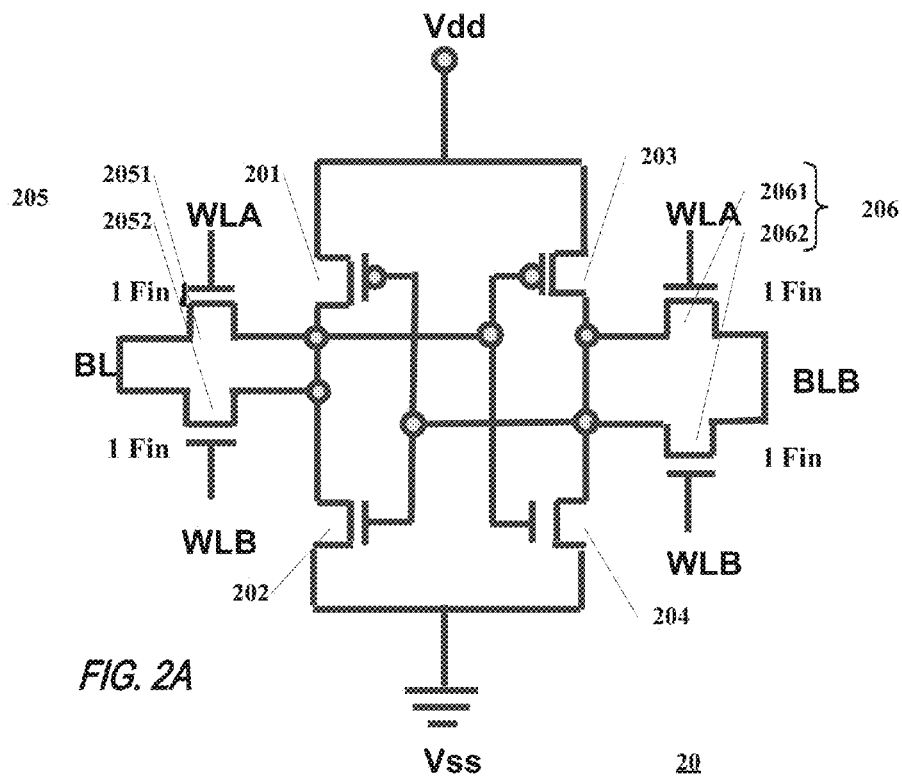
FIG. 2A is a circuit diagram of a static random access memory device according to some embodiments of the present invention.
Figure 2B:
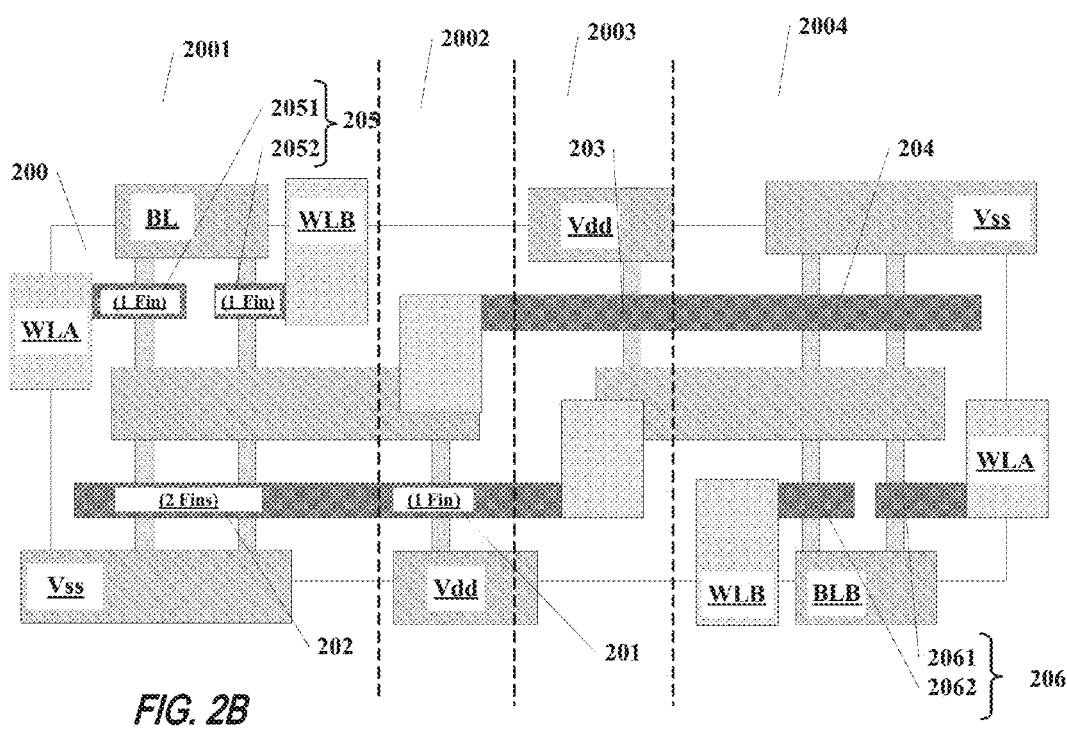
FIG. 2B is a layout of some components of a static random access memory device according to some embodiments of the present invention.

FIG. 2A is a circuit diagram of a static random access memory circuit according to some embodiments of the present invention. FIG. 2B is a layout of some components of the static random access memory cell according to some embodiments of the present invention. The static random access memory circuit in FIG. 2A is shown as being a symmetrical memory cell including two units each having a PU transistor, a PD transistor, and a PG transistor. The ratio of the number of Fins of the PU transistor, the number of Fins of PD transistor, and the number of Fins of PG transistor is 1:2:2. FIG. 2B is a layout corresponding to the static random access memory circuit of FIG. 2A. The static random access memory circuit is described in detail below.

Referring to FIGS. 2A and 2B, the static random access memory circuit includes a first PU transistor 201, a first PD transistor 202, a first PG transistor 205, a second PU transistor 203, a first PD transistor 204, and a first PG transistor 206. First PU transistor 201 includes a source electrically connected to a voltage source Vdd. First PD transistor 202 includes a source electrically connected to ground Vss, a drain connected to a drain of first PU transistor 201, and a gate connected to a gate of the first PU transistor. One of the source or the drain (e.g., the source) of PG transistor 205 is connected to a bit line BL, and the other drain or the source (e.g., the drain) is connected to the drain of first PD transistor 202. First PG transistor 205 includes two sets of Fins (in the example two Fins are shown) and a gate associated with each set of Fins, a first word line WLA connected to the first set of Fins 2051 (the first Fin in this embodiment), a second word line WLB connected to the second set of Fins 2052 (the second Fin in this embodiment). The first gate connected to first word line WLA and the second gate connected to the second word line WLB are insulated from each other. Similarly, second PU transistor 203 includes a source electrically connected to the voltage source Vdd. Second PD transistor 204 includes a source electrically connected to ground Vss, a drain connected to a drain of second PU transistor 203, and a gate connected to a gate of the second PU transistor. One of the source or the drain (e.g., the source) of PG transistor 206 is connected to a complementary bit line BLB, and the other drain or the source (e.g., the drain) is connected to the drain of second PD transistor 204. Second PG transistor 206 includes two sets of Fins (two Fins are shown in the example) and a gate associated with each set of Fins, the first word line WLA connected to the first set of Fins 2061 (the first Fin in this embodiment), the second word line WLB connected to the second set of Fins 2062 (the second Fin in this embodiment). The first and second gates connected to the respective word lines WLA, WLB are insulated from each other.

The connection relationship between the source and drain of the first PG transistor and the other transistors symmetrically corresponds to the connection relation between the source and drain of the second PG transistor and the other transistors. That is, if the source of the first PG transistor is electrically connected to the bit line BL, the drain is electrically connected to the drain of the first PD transistor, the drain of the second PG transistor is electrically connected to the complementary bit line BLB, the drain is electrically connected to the drain of the second PD transistor. If the drain of the first PG transistor is electrically connected to the bit line BL, the source is electrically connected to the drain of the first PD transistor, the drain of the second PG transistor is electrically connected to the complementary bit line BLB, the source is electrically connected to the drain of the second PD transistor.

In this embodiment, the number of the Fins of first PU transistor 201 and the number of the Fins of second PU transistor 203 each are 1, the number of the Fins of first PD transistor 202 and the number of the Fins of second PD transistor 204 each are 2, the number of the Fins of first PG transistor 205 and the number of the Fins of second PG transistor 206 each are 2. The first gate disposed on one Fin of first PG transistor 205 is connected to the first word line WLA, the second gate on the other Fin of first PG transistor 205 is connected to the second word line WLB. The first gate on the Fin of second PG transistor 206 is connected to the first word line WLA, the second gate on the other Fin of second PG transistor 206 is connected to the second word line WLB, as shown in FIGS. 2A and 2B.

During a read operation, the first word line WLA is asserted high and the second word line WLB is asserted low, or the first word line WLA is asserted low and the second word line WLB is asserted high, in both cases the source and drain on opposite sides of first PG transistor 205 and second PG transistor 206 can be connected, and the source and drain of first PD transistor 202 and second PD transistor 204 can be connected. Since the ratio of the amount of current flowing through each transistor and the number of conducting Fins of each respective transistor is equal, so that when a read operation is performed, $$\beta = \frac{I_{PD}}{I_{PG}} = \frac{PD}{PG} = \frac{2}{1} = 2 > 1.2,$$

a better read noise margin can thus be achieved (e.g., greater than 100 mV).

During a write operation, the first word line WLA is asserted high and the second word line WLB is asserted high, the source and drain of first PG transistor 205 are connected, and the source and drain of second PG transistor 206 are connected, and each of the first PU transistor 201 and second PU transistor 203 is connected to the connected source and drain of the conducting PG transistor. Similarly, since the ratio of the amount of current of the conducting transistors is equal to the ratio of the number of Fins of the corresponding conducting transistors, in a write operation, $$\gamma = \frac{I'_{PG}}{I_{PU}} = \frac{PG}{PU} = \frac{2}{1} = 2 > 1.5,$$

an improved write margin can be obtained (e.g., greater than 200 mV).

In this embodiment, the gate on the Fins of the PG transistors includes a first gate connected to a first word line and a second gate connected to a second word line, during read and write operations, each of the first and second word lines can be asserted high or low according to application requirements, and a desired read noise margin and write margin can be obtained.

In some embodiments of the present invention, first PU transistor 201 and second PU transistor 203 can be PMOS (p-channel metal oxide semiconductor) transistors, first PD transistor 202 and second PU transistor 204 can be NMOS (n-channel metal oxide semiconductor) transistors. First PU transistor 201 and first PD transistor 202 form a first inverter, and second PU transistor 203 and second PD transistor 204 form a second inverter. In the embodiment, first PG transistor 205 and second PG transistor 206 can be NMOS transistors.

In the above-described embodiment, the first PU transistor, the first PD transistor, and the first PG transistor each have a number of Fins equal to the number of Fins of the second PU transistor, the second PD transistor, and the second PG transistor, which allows that the reading of "1" and "0" will have the same read speed and the writing of "1" and "0" will have the same write speed. Of course, those of skill in the art will appreciate that the number of Fins of corresponding transistors in the left unit and right unit of the static memory circuit may not be equal, i.e., a non-symmetric static memory circuit. For example, the number of Fins of the PU transistor in the first unit is not equal to the number of Fins of the PU transistor in the second unit, or the number of Fins of the PD transistor in the first unit is not equal to the number of Fins of the PD transistor in the second unit, or the number of Fins of the PG transistor in the first unit is not equal to the number of Fins of the PG transistor in the second unit. The non-symmetrical circuit may cause the read speed of "1" and "0" is not the same and the write speed of "1" and "0" is not the same.

In some embodiments of the present invention, in one of the two units, the number of Fins of the PU transistor is 1, the number of Fins of the PD transistor is 2, the number of Fins of the PG transistor is 2, the first gate on one Fin of the PG transistor is connected to the first word line, the second gate on the other one Fin of the PG transistor is connected to the second word line.

In other embodiments of the present invention, in each unit, the number of Fins of the PU transistor is 2, the number of Fins of the PD transistor is 4, the number of Fins of the PG transistor is 4, the first gate on 1 Fin of the PG transistor is connected to the first word line, the second gate on the other 3 Fins of the PG transistor is connected to the second word line; or the first gate on 2 Fins of the PG transistor is connected to the first word line, the second gate on the other 2 Fins of the PG transistor is connected to the second word line.

In the case where the static random access memory circuit includes a first gate disposed on one (1) Fin of the PG transistor connected to the first word line, a second gate on the other three (3) Fins of the PG transistor is connected to the second word line, during a read operation, the first word line is asserted high and the second word line is asserted low, so that $$\beta = \frac{I_{PD}}{I_{PG}} = \frac{PD}{PG} = \frac{4}{1} = 4 > 1.2;$$

or the first word line is asserted low and the second word line is asserted high, so that $$\beta = \frac{I_{PD}}{I_{PG}} = \frac{PD}{PG} = \frac{4}{3} = 1.33 > 1.2.$$

Both conditions provide an improved read noise margin. Of course, the high assertion of the first word line and the low assertion of the second word line provide a relatively better read noise margin. In a write operation, the first word line is asserted high and the second word line is asserted high, so that $$\gamma = \frac{I'_{PG}}{I_{PU}} = \frac{PG}{PU} = \frac{4}{2} = 2 > 1.5,$$

so that an improved write margin can be obtained.

In the case where the static random access memory circuit includes a first gate on two (2) Fins of the PG transistor connected to the first word line, a second gate on the other two (2) Fins of the PG transistor is connected to the second word line, during a read operation, the first word line is asserted high and the second word line is asserted low, or the first word line is asserted low and the second word line is asserted high, in both conditions, $$\beta = \frac{I_{PD}}{I_{PG}} = \frac{PD}{PG} = \frac{4}{2} = 2 > 1.2$$

to provide an improved read noise margin. In a write operation, the first word line is asserted high and the second word line is asserted high, so that $$\gamma = \frac{I'_{PG}}{I_{PU}} = \frac{PG}{PU} = \frac{4}{2} = 2 > 1.5,$$

to provide an improved write margin.

In yet other embodiments of the present invention, the number of Fins of the PU transistor is 3, the number of Fins of the PD transistor is 6, the number of Fins of the PG transistor is 6, the first gate on one Fin of the PG transistor is connected to the first word line, the second gate on the other five Fins of the PG transistor is connected to the second word line; or the first gate on two Fins of the PG transistor is connected to the first word line, the second gate on the other four Fins of the PG transistor is connected to the second word line; or the first gate on three Fins of the PG transistor is connected to the first word line, the second gate on the other three Fins of the PG transistor is connected to the second word line.

In the case where the static random access memory circuit includes a first gate on one Fin of the PG transistor connected to the first word line, a second gate on the other five Fins of the PG transistor is connected to the second word line, during a read operation, the first word line is asserted high and the second word line is asserted low, so that $$\beta = \frac{I_{PD}}{I_{PG}} = \frac{PD}{PG} = \frac{6}{1} = 6 > 1.2,$$

to provide an improved read noise margin. In a write operation, the first word line is asserted high and the second word line is asserted high, so that $$\gamma = \frac{I'_{PG}}{I_{PU}} = \frac{PG}{PU} = \frac{5}{3} = 1.67 > 1.5,$$

or the first word line is asserted low and the second word line is asserted high, so that $$\gamma = \frac{I'_{PG}}{I_{PU}} = \frac{PG}{PU} = \frac{5}{3} = 1.67 > 1.5$$

to provide an improved write margin. Of course, the high assertion of the first word line and the high assertion of the second word line provide a relatively better write margin.

In the case where the static random access memory circuit includes a first gate on two Fins of the PG transistor connected to the first word line, a second gate on the other four Fins of the PG transistor is connected to the second word line; during a read operation, the first word line is asserted high and the second word line is asserted low, so that $$\beta = \frac{I_{PD}}{I_{PG}} = \frac{PD}{PG} = \frac{6}{2} = 3 > 1.2,$$

or the first word line is asserted low and the second word line is asserted high, so that $$\beta = \frac{I_{PD}}{I_{PG}} = \frac{PD}{PG} = \frac{6}{4} = 1.5 > 1.2$$

to provide a better read noise margin. Of course, the high assertion of the first word line and the high assertion of the second word line provide a better read noise margin. In a write operation, the first word line is asserted high and the second word line is asserted high, so that $$\gamma = \frac{I'_{PG}}{I_{PU}} = \frac{PG}{PU} = \frac{6}{3} = 2 > 1.5$$

to achieve an improved write margin.

In the case where the static random access memory circuit includes a first gate on three Fins of the PG transistor connected to the first word line, a second gate on the other three Fins of the PG transistor is connected to the second word line, during a read operation, the first word line is asserted high and the second word line is asserted low, or the first word line is asserted low and the second word line is asserted high, in both conditions, so that $$\beta = \frac{I_{PD}}{I_{PG}} = \frac{PD}{PG} = \frac{6}{3} = 2 > 1.2$$

to achieve an improved read noise margin. In a write operation, the first word line is asserted high and the second word line is asserted high, so that $$\gamma = \frac{I'_{PG}}{I_{PU}} = \frac{PG}{PU} = \frac{6}{3} = 2 > 1.5$$

to achieve an improved write margin.

Of course, in the embodiment, the ratio of the number of Fins of the PU transistor, the number of Fins of the PD transistor, and the number of Fins of the PG transistor in each unit is 1:2:2 for the static random access memory circuit in other cases. For example, the number of Fins of the PU transistor, the number of Fins of the PD transistor, and the number of Fins of the PG transistor are 4, 8, and 8, respectively, an improved read noise margin and an improved write margin can be obtained.

Figure 3A:
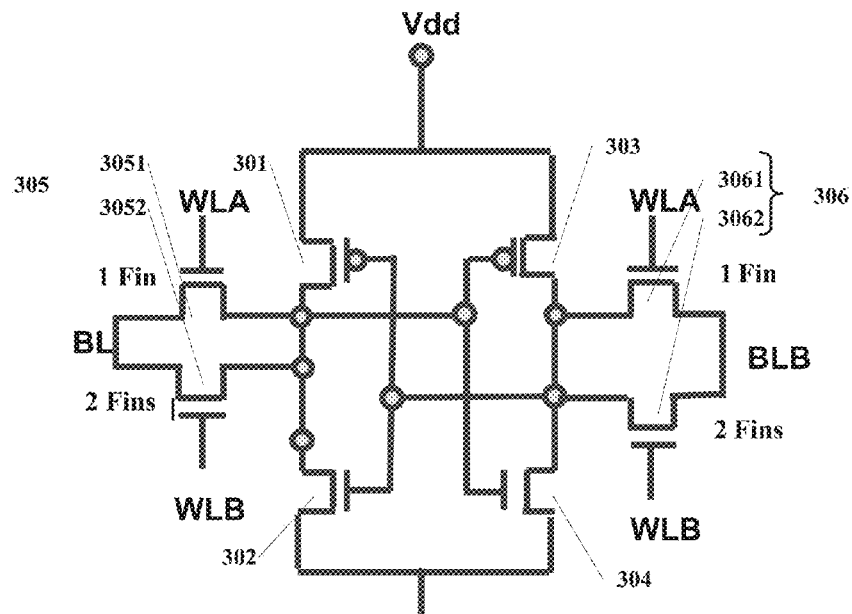
FIG. 3A is a circuit diagram of a static random access memory device according to some embodiments of the present invention.
Figure 3B:
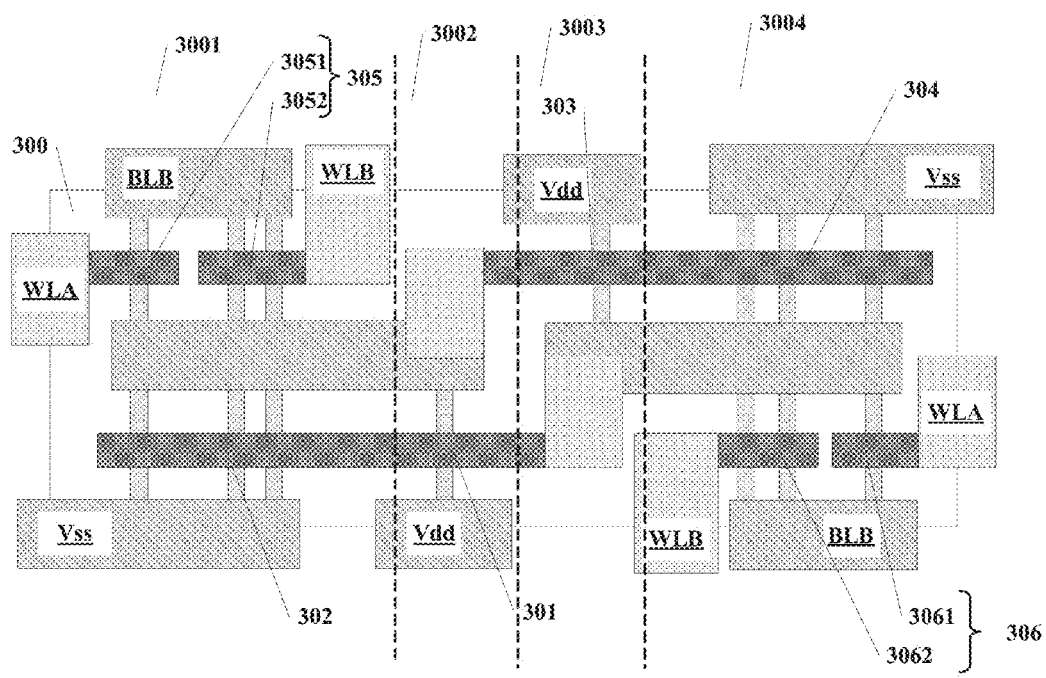
FIG. 3B is a layout of some components of a static random access memory device according to some embodiments of the present invention.

FIG. 3A is a circuit diagram of a static random access memory circuit according to some other embodiments of the present invention. FIG. 3B is a layout of some components of a static random access memory cell according to some embodiments of the present invention. The static random access memory circuit in FIG. 3A is shown as a symmetrical memory cell including two units each having a PU transistor, a PD transistor, and a PG transistor. The ratio of the number of Fins of the PU transistor, PD transistor, and PG transistor is 1:3:3. The static random access memory circuit of FIG. 3A includes a first PU transistor 301, a first PD transistor 302, a first PG transistor 305 comprising a first Fin set 3051 and a second Fin set 3052, a second PU transistor 303, a second PD transistor 304, a second PG transistor 306 comprising a first Fin set 3061 and a second Fin set 3062. The connection relation of the transistors of the static random access memory cell of FIG. 3A is similarly to the connection relationship of the static random access memory cell of FIG. 2A so that a description is omitted herein for the sake of brevity. FIG. 3B is a layout corresponding to the static random access memory circuit of FIG. 3A.

In this embodiment, the number of the Fins of first PU transistor 301 and the number of the Fins of second PU transistor 303 each are 1, the number of the Fins of first PD transistor 302 and the number of the Fins of second PD transistor 304 each are 3, the number of the Fins of first PG transistor 305 and the number of the Fins of second PG transistor 306 each are 3. The first gate on one Fin of first PG transistor 305 is connected to the first word line WLA, the second gate on the other 2 Fins of first PG transistor 305 is connected to the second word line WLB. The first gate on one Fin of second PG transistor 206 is connected to the first word line WLA, the second gate on the other 2 Fins of second PG transistor 206 is connected to the second word line WLB, as shown in FIGS. 3A and 3B.

During the read operation, the first word line WLA is asserted high and the second word line WLB is asserted low, so that $$\beta = \frac{I_{PD}}{I_{PG}} = \frac{PD}{PG} = \frac{3}{1} = 3 > 1.2,$$

or the first word line WLA is asserted low and the second word line WLB is asserted high, so that $$\beta = \frac{I_{PD}}{I_{PG}} = \frac{PD}{PG} = \frac{3}{2} = 1.5 > 1.2,$$

both conditions can provide an improved read noise margin (e.g., greater that 100 mV). Of course, the high assertion of WLA and a low assertion of WLB can provide a better read noise margin.

In a write operation, the first word line WLA is asserted high and a second word line WLB is asserted high, so that $$\gamma = \frac{I'_{PG}}{I_{PU}} = \frac{PG}{PU} = \frac{3}{1} = 3 > 1.5,$$

or the first word line WLA is asserted low and a second word line WLB is asserted high, so that $$\gamma = \frac{I'_{PG}}{I_{PU}} = \frac{PG}{PU} = \frac{2}{1} = 2 > 1.5,$$

both conditions provide an improved write margin (e.g., greater than 200 mV). Of course, the high assertion of the first word line and the high assertion of the second word line provide a better write margin.

In this embodiment, the gate on the Fins of the PG transistors includes a first gate connected to a first word line and a second gate connected to a second word line. During read and write operations, each of the first and second word lines can be asserted high or low according to application requirements, and a desired good read noise margin and write margin can be obtained.

Similar to the above-described embodiments, in other embodiments of the present invention, in only one unit of the static memory circuit the number of Fins of the PU transistor is 1, the number of Fins of the PD transistor is 3, and the number of Fins of the PG transistor is 3. The first gate on one Fin of the first PG transistor is connected to the first word line, the second gate on the other 2 Fins of first PG transistor is connected to the second word line.

In yet some other embodiments of the present invention, in each unit of the static memory circuit the number of Fins of the PU transistor is 2, the number of Fins of the PD transistor is 6, and the number of Fins of the PG transistor is 6. The first gate on one Fin of the first PG transistor is connected to the first word line, the second gate on the other 5 Fins of first PG transistor is connected to the second word line; or the first gate on two Fins of the first PG transistor is connected to the first word line, the second gate on the other 4 Fins of first PG transistor is connected to the second word line; or the first gate on three Fins of the first PG transistor is connected to the first word line, the second gate on the other 3 Fins of first PG transistor is connected to the second word line.

In the case where the static random access memory circuit includes a first gate on 1 Fin of the PG transistor connected to the first word line, a second gate on the other 5 Fins of the PG transistor is connected to the second word line, during a read operation, the first word line is asserted high and the second word line is asserted low, so that $$\beta = \frac{I_{PD}}{I_{PG}} = \frac{PD}{PG} = \frac{6}{1} = 6 > 1.2$$

to obtain an improved read noise margin. In a write operation, the first word line is asserted high and the second word line is asserted high, so that $$\gamma = \frac{I'_{PG}}{I_{PU}} = \frac{PG}{PU} = \frac{6}{2} = 3 > 1.5;$$

or the first word line is asserted low and the second word line is asserted high, so that $$\gamma = \frac{I'_{PG}}{I_{PU}} = \frac{PG}{PU} = \frac{5}{2} = 2.5 > 1.5$$

to obtain an improved write margin. Of course, the high assertion of the first word line and the high assertion of the second word line provide a better write margin.

In the case where the static random access memory circuit includes a first gate on 2 Fins of the PG transistor connected to the first word line, a second gate on the other 4 Fins of the PG transistor is connected to the second word line, during a read operation, the first word line is asserted high and the second word line is asserted low, so that $$\beta = \frac{I_{PD}}{I_{PG}} = \frac{PD}{PG} = \frac{6}{2} = 3 > 1.2;$$

or the first word line is asserted low and the second word line is asserted high, so that $$\beta = \frac{I_{PD}}{I_{PG}} = \frac{PD}{PG} = \frac{6}{4} = 1.5 > 1.2,$$

both conditions can provide a desired better read noise margin. Of course, the high assertion of the first word line and the high assertion of the second word line can provide a better read noise margin. In a write operation, the first word line is asserted high and the second word line is asserted high, so that $$\gamma = \frac{I'_{PG}}{I_{PU}} = \frac{PG}{PU} = \frac{6}{2} = 3 > 1.5$$

to obtain a better write margin.

In the case where the static random access memory circuit includes a first gate on 3 Fins of the PG transistor connected to the first word line, a second gate on the other 3 Fins of the PG transistor is connected to the second word line, during a read operation, the first word line is asserted high and the second word line is asserted low, or so the first word line is asserted low and the second word line is asserted high, in both conditions $$\beta = \frac{I_{PD}}{I_{PG}} = \frac{PD}{PG} = \frac{6}{3} = 2 > 1.2$$

to obtain a desired better read noise margin. In a write operation, the first word line is asserted high and the second word line is asserted high, so that $$\gamma = \frac{I'_{PG}}{I_{PU}} = \frac{PG}{PU} = \frac{6}{2} = 3 > 1.5$$

to obtain a better write margin.

In some other embodiments of the present invention, in each of the two symmetrical units, the number of Fins of the PU transistor is 3, the number of Fins of the PD transistor is 9, and the number of Fins of the PG transistor is 9. The first gate on 1 Fin of the first PG transistor is connected to the first word line, the second gate on the other 8 Fins of the first PG transistor is connected to the second word line; or the first gate on 2 Fins of the first PG transistor is connected to the first word line, the second gate on the other 7 Fins of first PG transistor is connected to the second word line; or the first gate on 3 Fins of the first PG transistor is connected to the first word line, the second gate on the other 6 Fins of first PG transistor is connected to the second word line; or the first gate on 4 Fins of the first PG transistor is connected to the first word line, the second gate on the other 5 Fins of first PG transistor is connected to the second word line.

In the case where the static random access memory circuit includes a first gate on 1 Fin of the PG transistor connected to the first word line, a second gate on the other 8 Fins of the PG transistor is connected to the second word line, during a read operation, the first word line is asserted high and the second word line is asserted low, so that $$\beta = \frac{I_{PD}}{I_{PG}} = \frac{PD}{PG} = \frac{9}{1} = 9 > 1.2$$

to obtain an improved read noise margin. During a write operation, the first word line is asserted high and the second word line is asserted high, so that $$\gamma = \frac{I'_{PG}}{I_{PU}} = \frac{PG}{PU} = \frac{9}{3} = 3 > 1.5,$$

or the first word line is asserted low and the second word line is asserted high, so that $$\gamma = \frac{I'_{PG}}{I_{PU}} = \frac{PG}{PU} = \frac{8}{3} = 2.67 > 1.5,$$

in both conditions an improved write margin can be obtained. Of course, the high assertion of the first word line and the high assertion of the second word line provide a better write margin.

In the case where the static random access memory circuit includes a first gate on 2 Fins of the PG transistor connected to the first word line, a second gate on the other 7 Fins of the PG transistor is connected to the second word line, during a read operation, the first word line is asserted high and the second word line is asserted low, so that $$\beta = \frac{I_{PD}}{I_{PG}} = \frac{PD}{PG} = \frac{9}{2} = 4.5 > 1.2$$

to obtain an improved read noise margin. During a write operation, the first word line is asserted high and the second word line is asserted high, so that $$\gamma = \frac{I'_{PG}}{I_{PU}} = \frac{PG}{PU} = \frac{9}{3} = 3 > 1.5,$$

or the first word line is asserted low and the second word line is asserted high, so that $$\gamma = \frac{I'_{PG}}{I_{PU}} = \frac{PG}{PU} = \frac{7}{3} = 2.3 > 1.5,$$

in both conditions an improved write margin can be obtained. Of course, the high assertion of the first word line and the high assertion of the second word line provide a better write margin.

In the case where the static random access memory circuit includes a first gate on 3 Fins of the PG transistor connected to the first word line, a second gate on the other 6 Fins of the PG transistor is connected to the second word line, during a read operation, the first word line is asserted high and the second word line is asserted low, so that $$\beta = \frac{I_{PD}}{I_{PG}} = \frac{PD}{PG} = \frac{9}{3} = 3 > 1.2,$$

or the first word line is asserted low and the second word line is asserted high, so that $$\beta = \frac{I_{PD}}{I_{PG}} = \frac{PD}{PG} = \frac{9}{6} = 1.5 > 1.2,$$

in both conditions an improved read noise margin can be obtained. Of course, the high assertion of the first word line and the low assertion of the second word line provide a better read noise margin. During a write operation, the first word line is asserted high and the second word line is asserted high, so that $$\gamma = \frac{I'_{PG}}{I_{PU}} = \frac{PG}{PU} = \frac{9}{3} = 3 > 1.5$$

so that a desired improved write margin can be obtained.

In the case where the static random access memory circuit includes a first gate on 4 Fins of the PG transistor connected to the first word line, a second gate on the other 5 Fins of the PG transistor is connected to the second word line, during a read operation, the first word line is asserted high and the second word line is asserted low, so that $$\beta = \frac{I_{PD}}{I_{PG}} = \frac{PD}{PG} = \frac{9}{4} = 2.25 > 1.2,$$

the first word line is asserted low and the second word line is asserted high, so that $$\beta = \frac{I_{PD}}{I_{PG}} = \frac{PD}{PG} = \frac{9}{5} = 1.8 > 1.2,$$

in both conditions an improved read noise margin can be obtained. Of course, the high assertion of the first word line and the low assertion of the second word line provide a better read noise margin. During a write operation, the first word line is asserted high and the second word line is asserted high, so that $$\gamma = \frac{I'_{PG}}{I_{PU}} = \frac{PG}{PU} = \frac{9}{3} = 3 > 1.5$$

so that a desired improved write margin can be obtained.

Of course, in the embodiment, the ratio of the number of Fins of the PU transistor, the number of Fins of the PD transistor, and the number of Fins of the PG transistor in each unit may be 1:3:3 for the static random access memory circuit in other cases. For example, the number of Fins of the PU transistor, the number of Fins of the PD transistor, and the number of Fins of the PG transistor are 4, 12, and 12, respectively, an improved read noise margin and an improved write margin can be obtained.

In some other embodiments of the present invention, the ratio of the number of Fins of the PU transistor, the number of Fins of the PD transistor, and the number of Fins of the PG transistor and the ratio of the amount of current flowing through each corresponding transistor may be 1:4:4; 1:5:5, and the like to obtain a desired improved read noise margin and write margin.

In an embodiment of the present invention, the static memory cell includes a substrate (e.g., a silicon substrate) and a static random access memory circuit located on the substrate. For example, as shown in FIG. 2B, a static memory cell 20 includes a substrate 200, and a static random access memory circuit corresponding to the circuit of FIG. 2A and located on substrate 200. FIG. 3B is another example of a layout illustrating a static memory cell 30 including a substrate 300, and a static random access memory circuit corresponding to the circuit of FIG. 3A and located on substrate 300.

In some embodiments of the present invention, the substrate of a static memory cell may include a first active region, a second active region, a third active region, and a fourth active region. A unit includes a PU transistor located in the second active region, and a PD transistor and a PG transistor located in the first active region. Another unit includes a PU transistor located in the third active region, and a PD transistor and a PG transistor located in the fourth active region.

In an exemplary embodiment, substrate 200 includes a first active region 2001, a second active region 2002, a third active region 2003, and a fourth active region 2004. First PU transistor 201 is located in second active region 2002, first PD transistor 202 and first PG transistor 205 are located in first active region 2001, second PU transistor 203 is located in third active region 2003, and second PD transistor 204 and second PG transistor 206 are located in fourth active region 2004. In this embodiment, first active region 2001 is a p-well region, second active region 2002 is an n-well region, third active region 2003 is an n-well region, and fourth active region 2004 is a p-well region.

In another exemplary embodiment, substrate 300 includes a first active region 3001, a second active region 3002, a third active region 3003, and a fourth active region 3004. First PU transistor 301 is located in second active region 3002, first PD transistor 302 and first PG transistor 305 are located in first active region 3001, second PU transistor 303 is located in third active region 3003, and second PD transistor 304 and second PG transistor 306 are located in fourth active region 3004. In this embodiment, first active region 3001 is a p-well region, second active region 3002 is an n-well region, third active region 3003 is an n-well region, and fourth active region 3004 is a p-well region.

Figure 4:
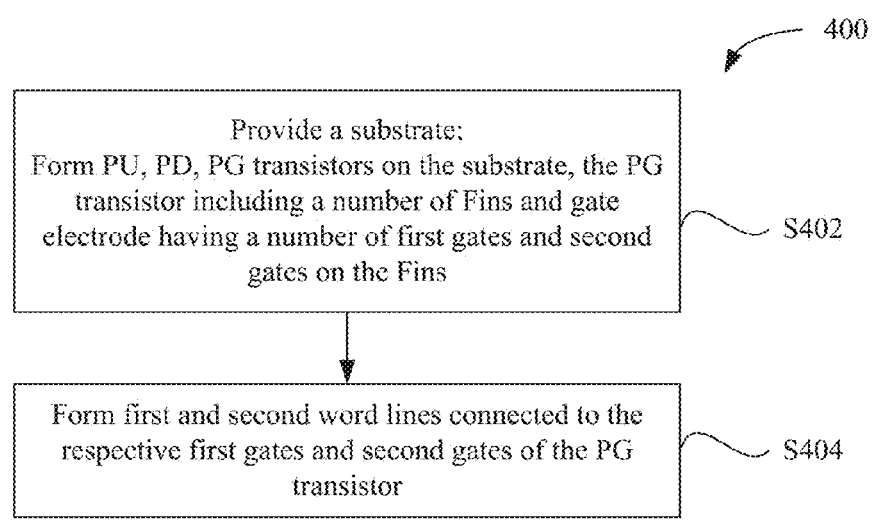
FIG. 4 is a flow chart diagram of a method for manufacturing a static random access memory cell according to some embodiments of the present invention.

FIG. 4 is a flow chart of a method 400 for manufacturing a static random access memory cell according to some embodiments of the present invention. At S402, a substrate is provided, PU transistors, PD transistors and PG transistors are formed on the substrate. A PG transistor includes two or more Fins, and a gate electrode is formed on each of corresponding Fins. The gate electrode includes a first gate and a second gate, which is electrically insulated from the first gate.

Figure 5:
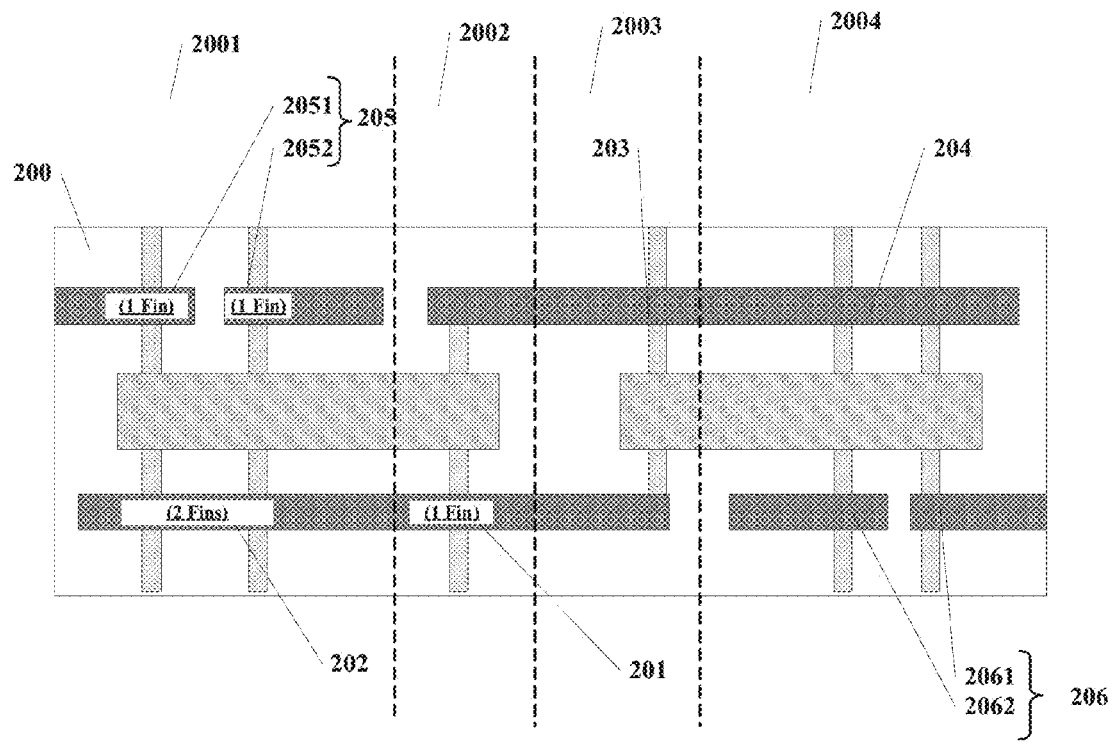
FIG. 5 is a layout of a stage of the manufacturing process of a static random access memory cell structure according to some embodiments of the present invention.

Referring to FIG. 5, a substrate 200 is provided. Substrate 200 includes a first PU transistor 201, a PD transistor 202, a first PG transistor 205, a second PU transistor 203, a second PD transistor 204, and a second PG transistor 206. First PG transistor 205 includes two Fins, a gate is formed on each Fin, the gate includes a first gate and a second gate insulated from each other. Substrate 200 also includes a first active region 2001, a second active region 2002, a third active region 2003, and a fourth active region 2004. First active region 2001 is a p-well region, second active region 2002 is an n-well region, third active region 2003 is an n-well region, and fourth active region 2004 is a p-well region.

As shown in FIG. 5, prior to forming first PG transistor 205, second PU transistor 203 and second PD transistor 204, a connecting polysilicon gate layer is first formed, thereafter, the polysilicon gate layer is patterned through a photolithography process to form a gate electrode of first PG transistor 205 and a gate electrode of second PU transistor 203, the gate of first transistor 205 is separated into a first gate on a Fin 2051 and a second gate on a Fin 2052 to form the gate electrode of first PG transistor 205, a gate of second PU transistor 203 and a gate of second PD transistor 204, as shown in FIG. 5. The gate of second PG transistor 206, the gate of first PU transistor 201 and the gate of first PD transistor 202 can be formed using a similar process as described above, and will not described herein for the sake of brevity.

In order to avoid obfuscating the inventive concept, well-known techniques and processes such as forming the transistors and the Fins will not be described herein. Those of ordinary skill in the art will be able to understand how to implement the invention after reading the above-described disclosure.

At S404, a first word line connected to the first gate is formed and a second word line connected to the second gate is formed.

Figure 6A:
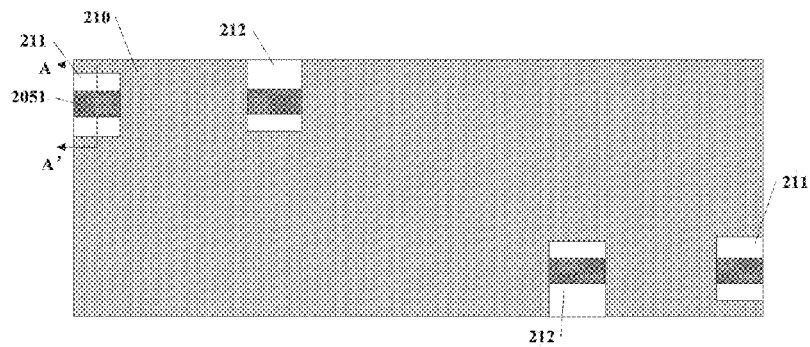
FIG. 6A is a top plan view of a layout of a stage of the manufacturing process of a structure of some components of a static random access memory cell according to some embodiments of the present invention.
Figure 6B:
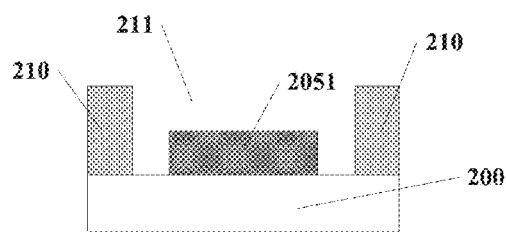
FIG. 6B is a cross-sectional view of a structure of some components of a static random access memory cell taken along the direction AA' of FIG. 6A.
Figure 7A:
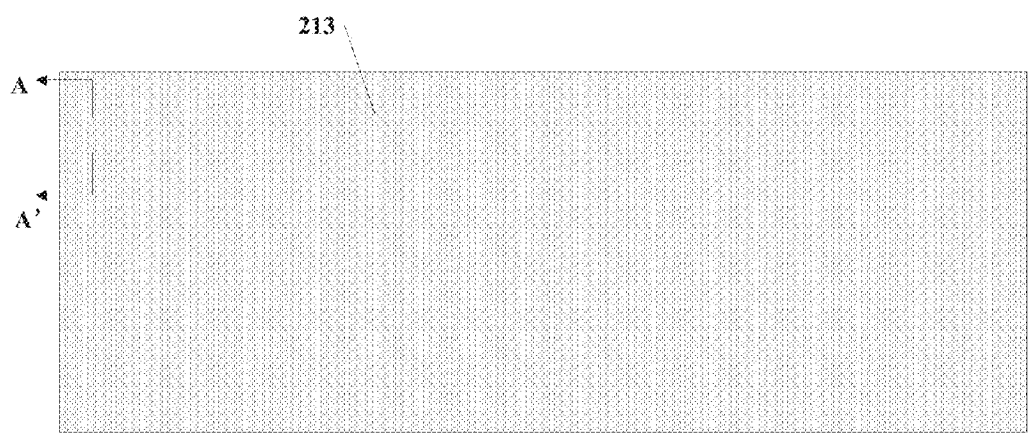
FIG. 7A is a layout of a stage of the manufacturing process of a structure of some components of a static random access memory device according to some embodiments of the present invention.
Figure 7B:
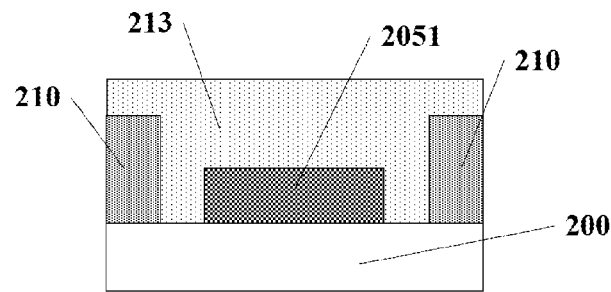
FIG. 7B is a cross-sectional view of a structure of some components of a static random access memory device taken along the direction AA' of FIG. 7A.

A process of forming first and second word lines connected to respective first and second gates will be described in detail below in conjunction with FIGS. 6A, 6B, 7A, 7B, 8A, and 8B. FIG. 6A is a top plan view illustrating a stage of forming word lines according to some embodiments of the present invention. FIG. 6B is a cross-sectional view illustrating a portion of the structure of FIG. 6A taken along the line AA'. FIG. 7A is a top plan view illustrating a stage of forming word lines according to some embodiments of the present invention. FIG. 7B is a cross-sectional view illustrating a portion of the structure of FIG. 7A taken along the line AA'.

First, an oxide layer is formed on a substrate, e.g., an oxide layer 210 is formed on substrate 200, as shown in FIG. 6A. Oxide layer 200 may be a silicon dioxide to cover substrate 200 including all transistors formed on the substrate.

Next, a first trench 211 corresponding to the location of a first word line and a second trench 212 corresponding to the location of a second word line are formed by etching oxide layer 210 (e.g., photolithographic etching), as shown in FIGS. 6A and 6B. First trench 211 and second trench 212 expose the polysilicon gate (not shown) on the Fin of a PG transistor, for example, first trench 211 exposes the polysilicon gate (i.e., the first gate, not shown) on Fin 2051 of first PG transistor, as shown in FIG. 6B.

Next, a metal material layer 213 is formed on oxide layer 210 filling the first and second trenches, as shown in FIGS. 7A and 7B.

Figure 8A:
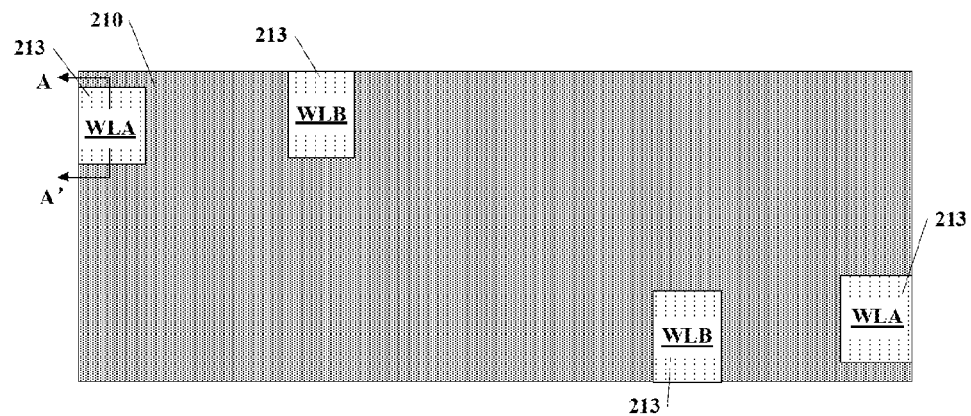
FIG. 8A is a top plan view of a layout of a stage of the manufacturing process of a structure of some components of a static random access memory cell according to some embodiments of the present invention.
Figure 8B:
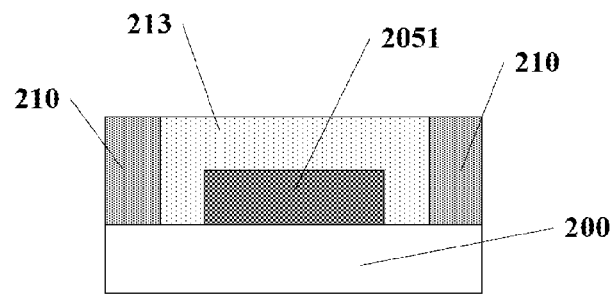
FIG. 8B is a cross-sectional view of a structure of some components of a static random access memory cell taken along the direction AA' of FIG. 8A.

Next, a planarization process (e.g., a chemical mechanical polishing) is performed to remove the excessive portion of the metal material layer external to the first and second trenches. The first trench filled with the metal may be the first word line WLA and the second trench filled with the metal may be the second word line WLB, as shown in FIGS. 8A and 8B.

In the embodiment of the present invention, the method of manufacturing a static memory cell may also include forming a bit line and processes of forming other metal wires or connections.

Thus, a static random access memory circuit and a method of manufacturing the same have been described. In accordance with the above-described embodiments of the present invention, the read noise margin is improved during a read operation, and the write margin is improved during a write operation.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A static memory circuit comprising:
a pull-up (PU) transistor comprising a number of Fins;
a pull-down (PD) transistor comprising a number of Fins;
a pass-gate (PG) transistor associated with the PU transistor and the PD transistor; and
first and second word lines electrically insulated from each other, wherein:
the PG transistor comprises a number of Fins, and a gate electrode comprising a number of first gates and a number of second gates each disposed on one of the Fins of the PG transistor, the first gates being connected to the first word line, and the second gates being connected to the second word line;
during a read operation, one of the first and second word lines is asserted low, so that a ratio of the number of Fins of the PD transistor and the number of Fins of the PG transistor is greater than or equal to a first predetermined value; and
during a write operation, one of the first and second word lines is asserted high, so that a ratio of the number of Fins of the PG transistor and the number of Fins of the PU transistor is greater than or equal to a second predetermined value.

2. The static memory circuit of claim 1, wherein a ratio of the number of Fins of the PU transistor, the number of Fins of the PD transistor, and the number of Fins of the PG transistor is 1:2:2.

3. The static memory circuit of claim 2, wherein the number of Fins of the PU transistor is 1, the number of Fins of the PD transistor is 2, the number of Fins of the PG transistor is 2, the number of first gates is 1, and the number of second gates is 1; or
the number of Fins of the PU transistor is 2, the number of Fins of the PD transistor is 4, the number of Fins of the PG transistor is 4, the number of first gates is 1, and the number of second gates is 3; or the number of first gates is 2, and the number of second gates is 2; or
the number of Fins of the PU transistor is 3, the number of Fins of the PD transistor is 6, the number of Fins of the PG transistor is 6, the number of first gates is 1, and the number of second gates is 5; or, the number of first gates is 2, and the number of second gates is 4; or, the number of first gates is 3, and the number of second gates is 3.

4. The static memory circuit of claim 1, wherein a ratio of the number of Fins of the PU transistor, the number of Fins of the PD transistor, and the number of Fins of the PG transistor is 1:3:3.

5. The static memory circuit of claim 4, wherein the number of Fins of the PU transistor is 1, the number of Fins of the PD transistor is 3, the number of Fins of the PG transistor is 3, the number of first gates is 1, and the number of second gates is 2; or
the number of Fins of the PU transistor is 2, the number of Fins of the PD transistor is 6, the number of Fins of the PG transistor is 6, the number of first gates is 1, and the number of second gates is 5; or, the number of first gates is 2, and the number of second gates is 4; or, the number of first gates is 3, and the number of second gates is 3; or
the number of Fins of the PU transistor is 3, the number of Fins of the PD transistor is 9, the number of Fins of the PG transistor is 9, the number of first gates is 1, and the number of second gates is 8; or, the number of first gates is 2, and the number of second gates is 7; or, the number of first gates is 3, and the number of second gates is 6, or, the number of first gates is 4, and the number of second gates is 5.

6. The static memory circuit of claim 1, wherein the first predetermined value is 1.2 and the second predetermined value is 1.5.

7. The static memory circuit of claim 1, wherein the PU transistor is a PMOS transistor, and each of the PD and PG transistors is an NMOS transistor.

8. A static memory circuit comprising:
a number of word lines;
a bit line; and
first and second units, each of the first and second units comprising:
a pull-up (PU) transistor comprising a number of Fins;
a pull-down (PD) transistor comprising a number of Fins;
a pass-gate (PG) transistor comprising:
a number of Fins;
a gate electrode connected to the word line;
a source or a drain connected to the bit line; wherein
a ratio of the number of Fins of the PD transistor and the number of Fins of the PG transistor is greater than or equal to a first predetermined value; and
a ratio of the number of Fins of the PG transistor and the number of Fins of the PU transistor is greater than or equal to a second predetermined value.

9. The static memory circuit of claim 8, wherein the number of word lines is 1, a ratio of the number of Fins of the PU transistor, the number of Fins of the PD transistor, and the number of Fins of the PG transistor is 1:4:2.

10. The static memory circuit of claim 8, wherein the number of word lines is 2 including a first word line and a second word line electrically insulated from each other; the gate electrode comprises a number of first gates and a number of second gates each disposed on one of the Fins of the PG transistor, the first gates being connected to the first word line, and the second gates being connected to the second word line; wherein one of the first and second word lines is asserted low during a read operation, and asserted high during a write operation.

11. The static memory circuit of claim 8, wherein:
the number of Fins of the PU transistor in the first unit is equal to the number of Fins of the PU transistor in the second unit;

the number of Fins of the PD transistor in the first unit is equal to the number of Fins of the PD transistor in the second unit; and the number of Fins of the PG transistor in the first unit is equal to the number of Fins of the PG transistor in the second unit.

12. The static memory circuit of claim 8, wherein:

the number of Fins of the PU transistor in the first unit is not equal to the number of Fins of the PU transistor in the second unit; or the number of Fins of the PD transistor in the first unit is not equal to the number of Fins of the PD transistor in the second unit; or the number of Fins of the PG transistor in the first unit is not equal to the number of Fins of the PG transistor in the second unit.

13. A semiconductor device comprising:

a substrate; and a static memory circuit comprising:
 a number of word lines;
 a bit line; and
 first and second units, each of the first and second units comprising:
  a pull-up (PU) transistor comprising a number of Fins;
  a pull-down (PD) transistor comprising a number of Fins;
  a pass-gate (PG) transistor comprising a number of Fins, a gate electrode connected to the word lines, and a source or a drain connected to the bit line;
 wherein:
 a ratio of the number of Fins of the PD transistor and the number of Fins of the PG transistor is greater than or equal to a first predetermined value; and
 a ratio of the number of Fins of the PG transistor and the number of Fins of the PU transistor is greater than or equal to a second predetermined value.

14. The semiconductor device of claim 13, wherein the substrate comprises a first active region, a second active region, a third active region, and a fourth active region, wherein:

in the first unit, the PU transistor is disposed in the second active region, and the PD transistor and the PG transistor are disposed in the first active region; and in the second unit, the PU transistor is disposed in the third active region, and the PD transistor and the PG transistor are disposed in the fourth active region.

15. The semiconductor device of claim 14, wherein the first active region is a p-well region, the second active region is an n-well region, the third active region is an n-well region, and the fourth active region is a p-well region.

* * * * *